United States Patent
Weikert

(10) Patent No.: US 11,269,057 B2
(45) Date of Patent: Mar. 8, 2022

(54) SYSTEM AND METHOD FOR RADAR OBJECT SIMULATION

(71) Applicant: Rohde & Schwarz GmbH & Co. KG, Munich (DE)

(72) Inventor: Oomke Weikert, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 534 days.

(21) Appl. No.: 16/298,539

(22) Filed: Mar. 11, 2019

(65) Prior Publication Data

US 2021/0405152 A1  Dec. 30, 2021

(51) Int. Cl.
*G01S 7/40* (2006.01)
*H03H 17/06* (2006.01)
*H04B 1/40* (2015.01)

(52) U.S. Cl.
CPC ........... *G01S 7/4052* (2013.01); *H03H 17/06* (2013.01); *H04B 1/40* (2013.01)

(58) Field of Classification Search
CPC .......... G01S 7/4052; H03H 17/06; H04B 1/40
See application file for complete search history.

(56) References Cited

U.S. PATENT DOCUMENTS

| | | | |
|---|---|---|---|
| 2006/0133551 A1* | 6/2006 | Davidoff | H04B 1/001 375/350 |
| 2009/0141830 A1* | 6/2009 | Ye | H03F 1/02 375/320 |
| 2009/0309783 A1 | 12/2009 | Shih et al. | |
| 2018/0329027 A1* | 11/2018 | Eshraghi | G01S 7/354 |

FOREIGN PATENT DOCUMENTS

DE  102016121296 A1  5/2018

* cited by examiner

*Primary Examiner* — Dac V Ha
(74) *Attorney, Agent, or Firm* — Ditthavong, Steiner & Mlotkowski

(57) ABSTRACT

A system for radar object simulation is provided. The system comprises a filter unit with a plurality of filter paths, a processing unit and a communication interface. In this context, each of the plurality of filter paths comprises a number of coefficients corresponding to the distance of a simulated object. In addition, the processing unit is configured to select a filter path of the plurality of filter paths based on the number of coefficients.

20 Claims, 3 Drawing Sheets

SYSTEM AND METHOD FOR RADAR OBJECT SIMULATION

TECHNICAL FIELD

The invention relates to a system and a corresponding method for radar object simulation, especially for compensating frequency response and IQ imbalances introduced by the high-frequency components in radar test systems.

BACKGROUND ART

With an increasing application of radar in the industrial, automotive and private sectors, there is a growing need for testing the radar sensors in their operating environments. The common way of testing such systems is to simulate radar objects with a defined distance, velocity and size. However, the high-frequency components of the test simulator are prone to induce a frequency response and IQ imbalances that deteriorate the system performance. In general, the compensation is carried out by using filtering units, for instance Finite Impulse Response (FIR) filters or optical delay lines to provide sufficient delay and can completely compensate the abnormalities if the distance of the simulated object is sufficiently large. Disadvantageously, the said compensation cannot be performed for an object to be simulated close to the Radome since the compensation is deactivated in the transition area, which leads to a very long processing time and consequently a reduced system efficiency.

For example, US 2009/0309783 A1 demonstrates a millimeter wave radar target simulator that converts an incoming radar signal by an electrical-to-optical modulator. The converted signal is delayed through an optical delay line and then demodulated by an optical-to-electrical demodulator to a signal having a frequency that simulates a millimeter wave radar target return.

Accordingly, there is a need to provide a system and a corresponding method for radar object simulation that can compensate the frequency response and the IQ imbalances for objects, which are to be simulated very close to the Radome and hence improves system efficiency.

SUMMARY OF THE INVENTION

According to a first aspect of the invention, a system for radar object simulation is provided. The system comprises a filter unit with a plurality of filter paths, a processing unit and a communication interface. In this context, each of the plurality of filter paths comprises a number of coefficients corresponding to the distance of a simulated object. In addition, the processing unit is configured to select a filter path of the plurality of filter paths based on the number of coefficients. Therefore, a simulated object that is closer or farther from the same direction is simulated at a large distance with compensation of the frequency response in a transition area. Advantageously, the compensation is carried out even if the simulated target is very close to the Radome and hence the system efficiency improves significantly.

According to a first preferred implementation form of said first aspect of the invention, at least one filter path comprises a different number of coefficients with respect to remaining filter paths. Advantageously, the distinction of filter paths is considerably increased.

According to a second preferred implementation form of said first aspect of the invention, the processing unit is further configured to assign different filter paths corresponding to different distances of simulated objects. Advantageously, a different number of filter coefficients are selected depending on the distance of the object to be simulated in the transition area.

According to a third preferred implementation form of said first aspect of the invention, the filter paths corresponding to higher distances of simulated objects comprise a higher number of coefficients. In addition, the filter paths corresponding to closer simulated objects comprise a lower number of coefficients. Advantageously, the distinction of filter paths is further increased.

According to a further preferred implementation form of said first aspect of the invention, the processing unit comprises a memory element and is further configured to store the coefficients of the plurality of filter paths in the memory element. Advantageously, the coefficients can be further utilized for a similar test setup which significantly reduce the processing time.

According to a further preferred implementation form of said first aspect of the invention, the processing unit is further configured to define a threshold for lower distances of simulated objects. In this context, it is further advantageous that the processing unit is configured to bypass the filter unit for distances of simulated objects below the defined threshold. Hence, the filter unit is bypassed instead of completely switched off for distances that are below the predefined limit, which further improves system efficiency.

According to a further preferred implementation form of said first aspect of the invention, the filter unit comprises a multiplexer, configured to combine output signals from the filter paths selected by the processing unit. Advantageously, the compensation is performed in a simplified manner.

According to a further preferred implementation form of said first aspect of the invention, the processing unit further comprises a sequencer, configured to control the output signal flow of the multiplexer. Advantageously, the system efficiency is further improved.

According to a further preferred implementation form of said first aspect of the invention, the communication interface comprises analog-to-digital conversion means, digital-to-analog conversion means and an antenna. In this context, the communication interface is configured to transmit signals to and from the processing unit. Advantageously, by way of the transceiving scheme, a low cost and simplified simulation system is provided.

According to a second aspect of the invention, a method for radar object simulation in a system comprising a filter unit with a plurality of filter paths, a processing unit and a communication unit is provided. The method performs the steps of assigning a number of coefficients for each of the plurality of filter paths corresponding to the distance of a simulated object and selecting a filter path of the plurality of filter paths based on the number of coefficients. Therefore, a simulated object that is closer or farther from the same direction is simulated at a large distance with compensation of the frequency response in a transition area. Advantageously, the compensation is carried out even if the simulated target is very close to the Radome and hence the system efficiency improves significantly.

According to a first preferred implementation form of said second aspect of the invention, the method further comprises the step of assigning a different number of coefficients for at least one filter path with respect to remaining filter paths. Advantageously, the distinction of filter paths is considerably increased.

According to a second preferred implementation form of said second aspect of the invention, the method further comprises the step of assigning different filter paths corresponding to different distances of simulated objects. Advantageously, a different number of filter coefficients are selected depending on the distance of the object to be simulated in the transition area.

According to a third preferred implementation form of said second aspect of the invention, the method further comprises the step of allocating a higher number of coefficients for the filter paths corresponding to higher distances of simulated objects. In addition, the method further comprises the step of allocating a lower number of coefficients for the filter paths corresponding to closer simulated objects. Advantageously, the distinction of filter paths is further increased.

According to a further preferred implementation form of said second aspect of the invention, the processing unit comprises a memory element and wherein the method further comprises the step of storing the coefficients of the plurality of filter paths in the memory element. Advantageously, the coefficients can be further utilized for a similar test setup which significantly reduce the processing time.

According to a further preferred implementation form of said second aspect of the invention, the method further comprises the step of defining a threshold for lower distances of simulated objects. In this context, it is further advantageous that the method comprises the step of bypassing the filter unit for distances of simulated objects below the defined threshold. Hence, the filter unit is bypassed instead of completely switched off for distances that are below the predefined limit, which further improves system efficiency.

According to a further preferred implementation form of said second aspect of the invention, the filter unit comprises a multiplexer and wherein the method further comprises the step of combining output signals from the filter paths selected by the processing unit. Advantageously, the compensation is performed in a simplified manner.

According to a further preferred implementation form of said second aspect of the invention, the processing unit further comprises a sequencer and wherein the method further comprises the step of controlling the output signal flow of the multiplexer. Advantageously, the system efficiency is further improved.

According to a further preferred implementation form of said second aspect of the invention, the method further comprises the step of transmitting signals to and from the processing unit by means of the communication interface. Advantageously, by way of the transceiving scheme, a low cost and simplified simulation system is provided.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
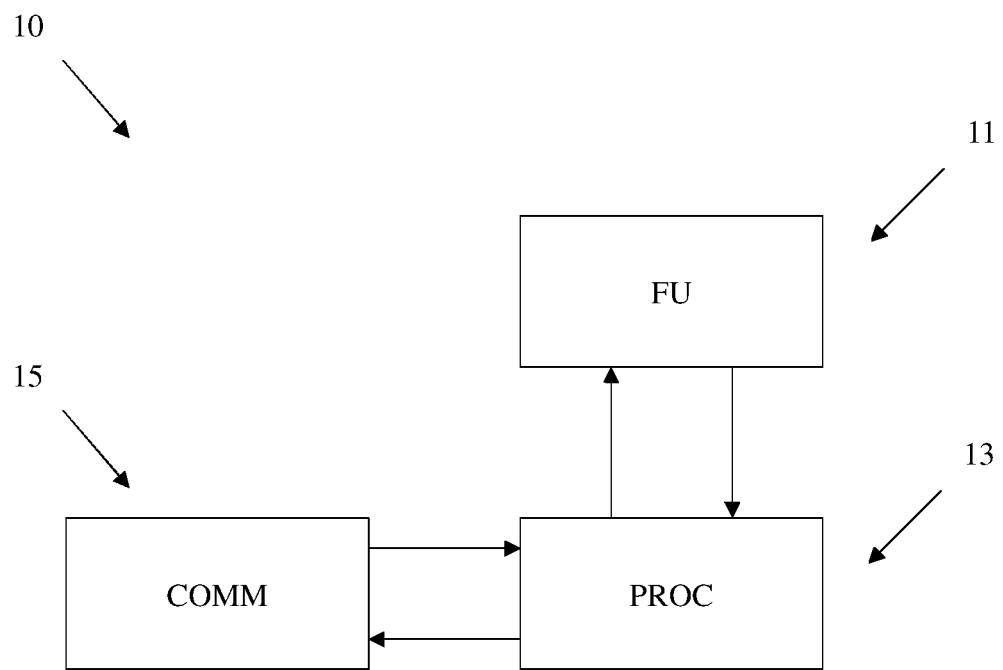
FIG. 1 shows an exemplary embodiment of the system according to the first aspect of the invention.

First, we demonstrate the general construction and function of an exemplary embodiment of the system of the first aspect of the invention, along FIG. 1. Along FIG. 2, the exemplary embodiment of the system according to the first aspect of the invention is described in detail. Finally, with regard to the flow chart of FIG. 3, an exemplary embodiment of the method according to the second aspect of the invention is described.

Reference will now be made in detail to the embodiments of the present invention, examples of which are illustrated in the accompanying drawings. Similar entities and reference numbers in different figures have been partially omitted. However, the following embodiments of the present invention may be variously modified and the range of the present invention is not limited by the following embodiments.

In FIG. 1, an exemplary embodiment of the inventive system 10 for radar object simulation is illustrated. The system 10 comprises a filter unit 11, a processing unit 13 and a communication interface 15. In this context, the filter unit 11 comprises a plurality of filter paths $21a, 21b, \ldots, 21m, 21n$ which is further illustrated along FIG. 2, where each of the plurality of filter paths $21a, 21b, \ldots, 21m, 21n$ comprises a number of coefficients corresponding to the distance of a simulated object. The processing unit 13 selects a filter path of the plurality of filter paths $21a, 21b, \ldots, 21m, 21n$ based on the number of coefficients, which correspondingly regard the distance of the object to be simulated. It is to be noted that the processing unit 13 is interconnected with the filter unit 11 as well as with the communication interface 15 by means of standard transmission lines, for instance coaxial cables, optical fibers and so on. It is also possible that the filter unit 11 and/or the communication interface 15 can be formed as an integral component of the processing unit 13. The processing unit 13 comprises, preferably, a Field Programmable Gate Array (FPGA) to perform digital signal processing.

Figure 2:
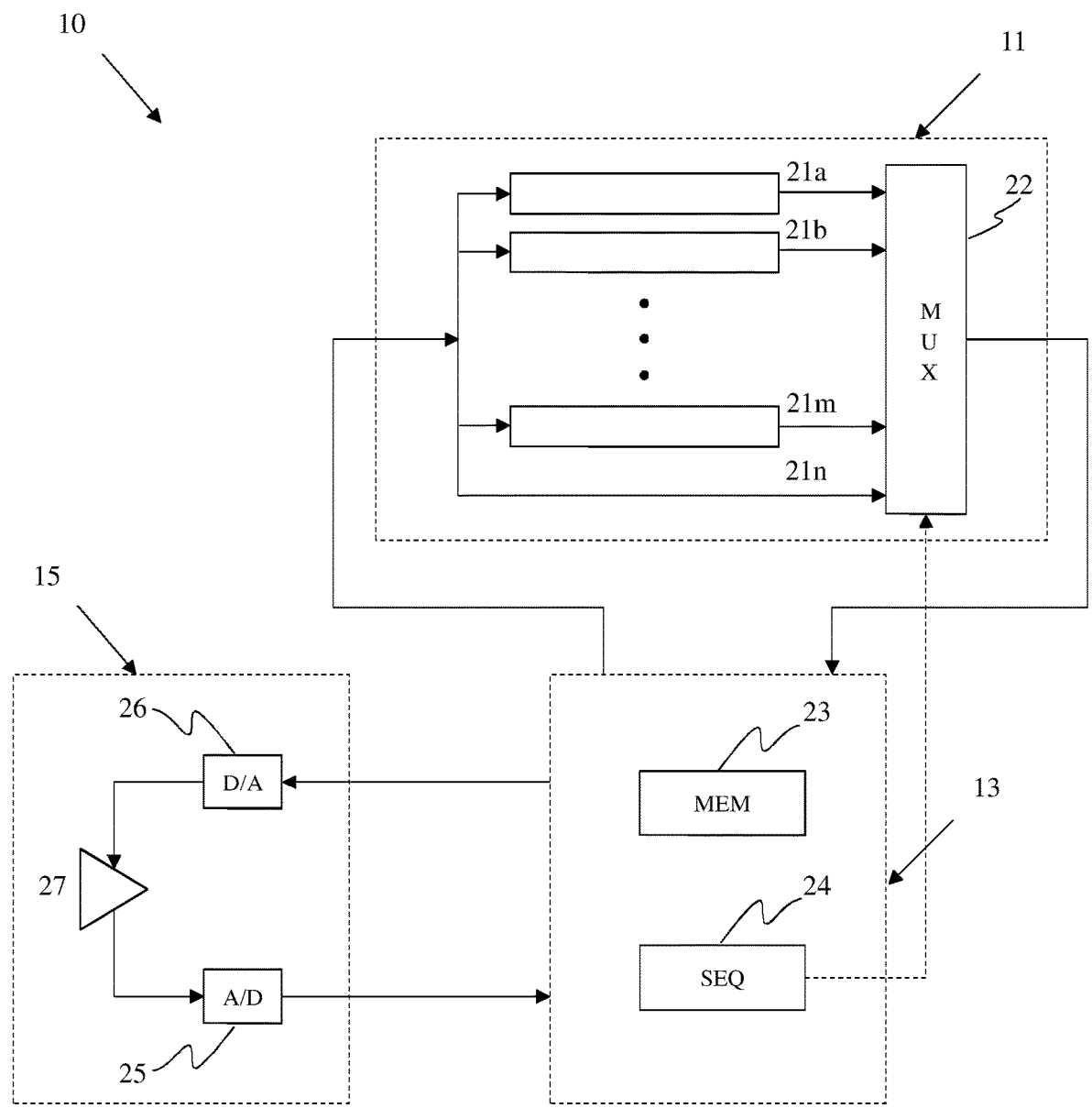
FIG. 2 shows a more detailed view of the exemplary embodiment of the system according to the first aspect of the invention.

In FIG. 2, a more detailed view of the exemplary embodiment of the inventive system 10 for radar object simulation is illustrated. Here, the internal components of filter unit 11, processing unit 13 and communication interface 15 are described in greater detail.

In this context, the filter unit 11 includes a plurality of filter paths $21a, 21b, \ldots, 21m, 21n$ where at least one filter path comprises a different number of coefficients with respect to remaining filter paths. Preferably, the filter paths corresponding to higher distances of simulated objects comprise a higher number of coefficients and the filter paths corresponding to closer simulated objects comprise a lower number of coefficients. For instance, in case of FIR filters, each path can be defined through an N stage delay line with N+1 taps, wherein the number of taps correspond to the distance of the simulated object. By way of example only, the filter path 21a may comprises 20 taps, the filter path 21b may comprises 19 taps and so on. Hence, the top to bottom filter path distribution results in the distance distribution from higher to lower with respect to the Radome for a simulated object. Advantageously, the processing unit 13 can provide appropriate delay for frequency response compensation by assigning different filter paths corresponding to different distances of simulated objects. The filter unit 11 further comprises a multiplexer 22 to combine output signals from the filter paths that are assigned and are selected by the processing unit 13 with respect to the distances of simulated objects.

The communication interface 15 comprises an analog-to-digital converter (ADC) 25, a digital-to-analog converter (DAC) 26 and an antenna 27. Preferably, the antenna 27 is a form of horn antenna that picks up the signal from radar and transmits to the processing unit 13, especially to the FPGA by means of the ADC 25. In FPGA, digital signal processing is performed to simulate radar objects and the processing unit 13 transmits back the modified signal to the radar via the DAC 26 and the antenna 27.

The processing unit 13 comprises a memory element 23, where the coefficients of the plurality of filter paths 21a, 21b, ... ,21m,21n are stored and advantageously can be further utilized for a similar test setup. In addition to this, the processing unit 13 comprises a sequencer 24 that controls the output signal flow of the multiplexer 22. In this context, the processing unit 13 defines a threshold for lower distances of simulated objects and can advantageously bypass the filter unit 11 for distances of simulated objects below the defined threshold, for instance by means of the sequencer 24.

In general, the simulated objects that are very close to the Radome fall in the transition region where the group delay of the compensation filter is greater than the digitally necessary delay to simulate the object and hence the compensation is completely deactivated. The inventive system 10 allows the processing unit 13 by means of the filter unit 11 to simulate objects at a large distance whether the objects are closer or farther from the Radome by compensating the frequency response and to assign a different filter coefficients in the transition region depending on the distance of the object to be simulated. In this context, if the simulated object has a distance that, for example corresponds to a sampling clock, the received signal is also delayed by one sampling clock and hence the group delay of the filter unit 11 is reduced by one delay analogous to the sampling clock. Accordingly, the impulse response length is reduced by said one delay and the processing unit 13 performs this procedure repeatedly until the group delay of the filter unit 11 reaches to zero. Advantageously, the largest possible proportion of the frequency response and the IQ imbalances is compensated instead of completely switching off the compensation in the case where the objects to be simulated are very close to the Radome.

Figure 3:
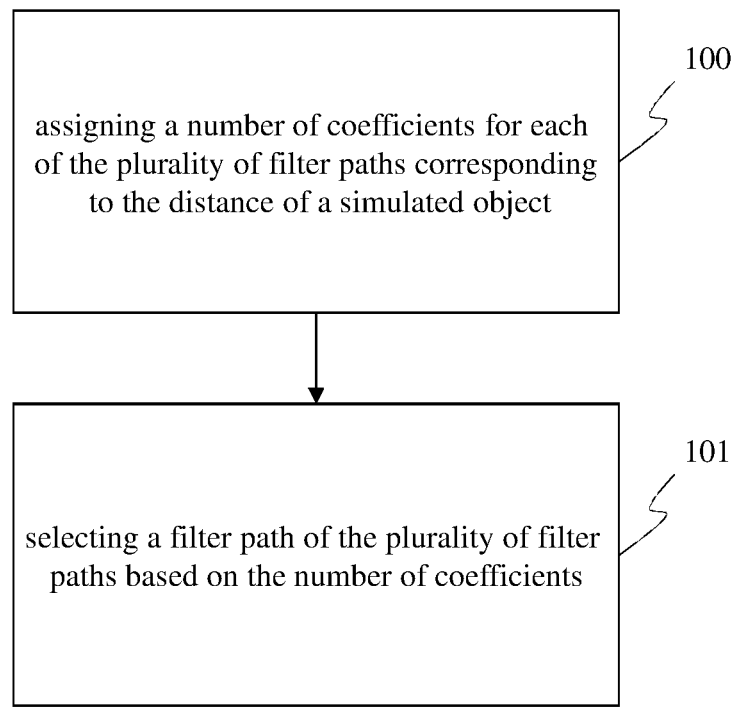
FIG. 3 shows a flow chart of an exemplary embodiment of the method according to the second aspect of the invention.

In FIG. 3, a flow chart of an exemplary embodiment of the inventive method for radar object simulation is illustrated. In a first step 100, a number of coefficients are assigned for each of the plurality of filter paths corresponding to the distance of a simulated object. In a second step 101, a filter path of the plurality of filter paths is selected based on the number of coefficients.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system for radar object simulation comprises:
a filter unit with a plurality of filter paths,
a processing unit, and
a communication interface;
wherein each of the plurality of filter paths comprises a number of coefficients corresponding to the distance of a simulated object, and
wherein the processing unit is configured to select a filter path of the plurality of filter paths based on the number of coefficients.

2. The system according to claim 1,
wherein at least one filter path comprises a different number of coefficients with respect to remaining filter paths.

3. The system according to claim 1,
wherein the processing unit is further configured to assign different filter paths corresponding to different distances of simulated objects.

4. The system according to claim 1,
wherein the filter paths corresponding to higher distances of simulated objects comprise a higher number of coefficients, and
wherein the filter paths corresponding to closer simulated objects comprise a lower number of coefficients.

5. The system according to claim 1,
wherein the processing unit comprises a memory element and is further configured to store the coefficients of the plurality of filter paths in the memory element.

6. The system according to claim 1,
wherein the processing unit is further configured to define a threshold for lower distances of simulated objects.

7. The system according to claim 6,
wherein the processing unit is further configured to bypass the filter unit for distances of simulated objects below the defined threshold.

8. The system according to claim 1,
wherein the filter unit comprises a multiplexer, configured to combine output signals from the filter paths selected by the processing unit.

9. The system according to claim 1,
wherein the processing unit further comprises a sequencer, configured to control the output signal flow of the multiplexer.

10. The system according to claim 1,
wherein the communication interface comprises analog-to-digital conversion means, digital-to-analog conversion means and an antenna, and
wherein the communication interface is configured to transmit signals to and from the processing unit.

11. A method for radar object simulation in a system comprising a filter unit with a plurality of filter paths, a processing unit and a communication unit, performing the steps of:
assigning a number of coefficients for each of the plurality of filter paths corresponding to the distance of a simulated object, and
selecting a filter path of the plurality of filter paths based on the number of coefficients.

12. The method according to claim 11,
wherein the method further comprises the step of assigning a different number of coefficients for at least one filter path with respect to remaining filter paths.

13. The method according to claim 11,
wherein the method further comprises the step of assigning different filter paths corresponding to different distances of simulated objects.

14. The method according to claim 11,
wherein the method further comprises the steps of:
  allocating a higher number of coefficients for the filter paths corresponding to higher distances of simulated objects, and
  allocating a lower number of coefficients for the filter paths corresponding to closer simulated objects.

15. The method according to claim 11,
wherein the processing unit comprises a memory element and wherein the method further comprises the step of storing the coefficients of the plurality of filter paths in the memory element.

16. The method according to claim 11,
wherein the method further comprises the step of defining a threshold for lower distances of simulated objects.

17. The method according to claim 11,
wherein the method further comprises the step of bypassing the filter unit for distances of simulated objects below the defined threshold.

18. The method according to claim 11,
wherein the filter unit comprises a multiplexer and wherein the method further comprises the step of combining output signals from the filter paths selected by the processing unit.

19. The method according to claim 11,
wherein the processing unit further comprises a sequencer and wherein the method further comprises the step of controlling the output signal flow of the multiplexer.

20. The method according to claim 11,
wherein the method further comprises the step of transmitting signals to and from the processing unit by means of the communication interface.

\* \* \* \* \*